United States Patent
Yeh et al.

(10) Patent No.: US 9,521,740 B2
(45) Date of Patent: Dec. 13, 2016

(54) ELECTRONIC DEVICE AND MANUFACTURING METHOD THEREOF

(71) Applicant: AVerMedia TECHNOLOGIES, INC., New Taipei (TW)

(72) Inventors: Chien-Ming Yeh, New Taipei (TW); Kuo-Ying Su, New Taipei (TW); Hong-Wei Liu, New Taipei (TW); Jeng-Hau Lin, New Taipei (TW)

(73) Assignee: AVERMEDIA TECHNOLOGIES, INC., New Taipei (TW)

( * ) Notice: Subject to any disclaimer, the term of this patent is extended or adjusted under 35 U.S.C. 154(b) by 273 days.

(21) Appl. No.: 14/059,453

(22) Filed: Oct. 22, 2013

(65) Prior Publication Data

US 2015/0109740 A1  Apr. 23, 2015

(51) Int. Cl.
*H05K 9/00* (2006.01)
*H05K 1/02* (2006.01)

(52) U.S. Cl.
CPC .......... *H05K 1/0216* (2013.01); *H05K 9/0022* (2013.01); *Y10T 29/49002* (2015.01)

(58) Field of Classification Search
CPC ............................. H05K 1/0216; H05K 9/0022
See application file for complete search history.

(56) References Cited

U.S. PATENT DOCUMENTS

| | | | | |
|---|---|---|---|---|
| 6,677,572 B2* | 1/2004 | Ishii | .................. | H01L 31/162 250/214.1 |
| 7,190,982 B2* | 3/2007 | Yamamoto | .......... | H05K 5/0091 455/422.1 |
| 7,365,536 B2 | 4/2008 | Crowley et al. | | |
| 8,324,020 B2* | 12/2012 | Eichelberger | ....... | H01L 21/6835 257/659 |
| 8,446,739 B2* | 5/2013 | Harikae | ................ | H01L 21/563 174/260 |
| 2012/0025356 A1 | 2/2012 | Liao et al. | | |
| 2014/0018018 A1* | 1/2014 | Inoue | ................... | H05K 9/0056 455/90.3 |
| 2014/0308907 A1* | 10/2014 | Chen | .................... | H04B 1/3838 455/90.3 |
| 2015/0130667 A1* | 5/2015 | Koskiniemi | .......... | H01Q 1/526 343/702 |
| 2016/0066481 A1* | 3/2016 | Malek | .................... | H05K 1/181 361/760 |

FOREIGN PATENT DOCUMENTS

| | | |
|---|---|---|
| CN | 102037714 A | 4/2011 |
| CN | 102781199 A | 11/2012 |
| TW | I298609 | 7/2008 |
| TW | 201010384 A | 3/2010 |
| TW | 201208033 A | 2/2012 |
| TW | M450194 | 4/2013 |

\* cited by examiner

*Primary Examiner* — Jeremy C Norris
*Assistant Examiner* — Nathan Milakovich
(74) *Attorney, Agent, or Firm* — CKC & Partners Co., Ltd.

(57) ABSTRACT

An electronic device includes a substrate, a first device, a second device, and a shielding wall. The first device and the second device are disposed on the substrate respectively. The shielding wall is disposed independently between the first device and the second device. The shielding wall is configured for suppressing the electromagnetic interference from the second device to the first device.

2 Claims, 4 Drawing Sheets

ELECTRONIC DEVICE AND MANUFACTURING METHOD THEREOF

BACKGROUND

Technical Field

The present invention relates to an electronic device. More particularly, the present invention relates to an electronic device with a shielding wall.

Description of Related Art

In recent years, with the advance of the communication technology, Electromagnetic Interference (EMI) is viewed as a serious problem when the electronic device is designed and manufactured. In short, the chips, the radio frequency components, or the metal conductive lines disposed on the printed circuit board (PCB) may be affected by other electronic components on the same PCB, which may result in faults of operation of the circuit. The conventional method for preventing from the electromagnetic interference is disposing a shielding box to cover the protected chips, the radio components, or the metal conductive lines entirely for preventing the above components from the electromagnetic inference around.

The conventional shielding box is a structure of the container. The shielding box includes a coverlid and a bottom frame. The bottom frame can be connected with the PCB through the Surface Mounted Device (SMD). The material of the bottom frame is too soft and the structure of the bottom frame is too slim, which results in that the shielding box is twisted or out of the shape during transportation. Moreover, SMD products still have problems of poor soldering, which further results in the reduction of the yield rate. Furthermore, it costs long time for assembling the shielding box since the coverlid is covered by handcraft.

On the other hand, the design of the shielding box is over-designed. Specifically, the designer supposes that the main electronic device is affected by the unknown source of the electromagnetic interference and disposes a metal shell surrounding the main electronic device entirely. In the field of Electromagnetic Compatibility (EMC), there are two principal ways for prevention from electromagnetic interference are blocking and flushing. In practical cases, the source of the interference can be predetermined in the processes of designing and debugging. In other words, the designer can block the source of the interference rather than block the interference by shielding surround the electronic components aimlessly. As a result, the electromagnetic inference can be effectively prevented and the quality of the product is enhanced.

SUMMARY

An aspect of the present invention is related to an electronic device. The electronic device includes a substrate, a first device, a second device, and a shielding wall. The first device and the second device are disposed on the substrate. The shielding wall is disposed independently between the first device and the second device and is configured for shielding electromagnetic interference from the second device to the first device. A height of the shielding wall is determined by a first distance between the first device and the shielding wall, a second distance between the second device and the shielding wall, and the electromagnetic interference from the second device to the first device.

Another aspect of the present invention is related to a method for manufacturing an electron device. The method for manufacturing the electronic device includes the operations below: disposing separately a first device and a second device on a substrate; disposing a shielding wall independently between the first device and the second device; determining a first distance between the first device and the shielding wall and a second distance between the second device and the shielding wall; obtaining an equivalent height of the shielding wall according to the first distance, the second distance, and a value of electromagnetic interference from the second device to the first device.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference to the accompanying drawings as follows.

DESCRIPTION OF THE EMBODIMENTS

In the following description, specific details are presented to provide a thorough understanding of the embodiments of the present invention. Persons of ordinary skill in the art will recognize, however, that the present invention can be practiced without one or more of the specific details, or in combination with other components. Well-known implementations or operations are not shown or described in detail to avoid obscuring aspects of various embodiments of the present invention.

The terms used in this specification generally have their ordinary meanings in the art and in the specific context where each term is used. The use of examples anywhere in this specification, including examples of any terms discussed herein, is illustrative only, and in no way limits the scope and meaning of the disclosure or of any exemplified term. Likewise, the present invention is not limited to various embodiments given in this specification.

Figure 1:
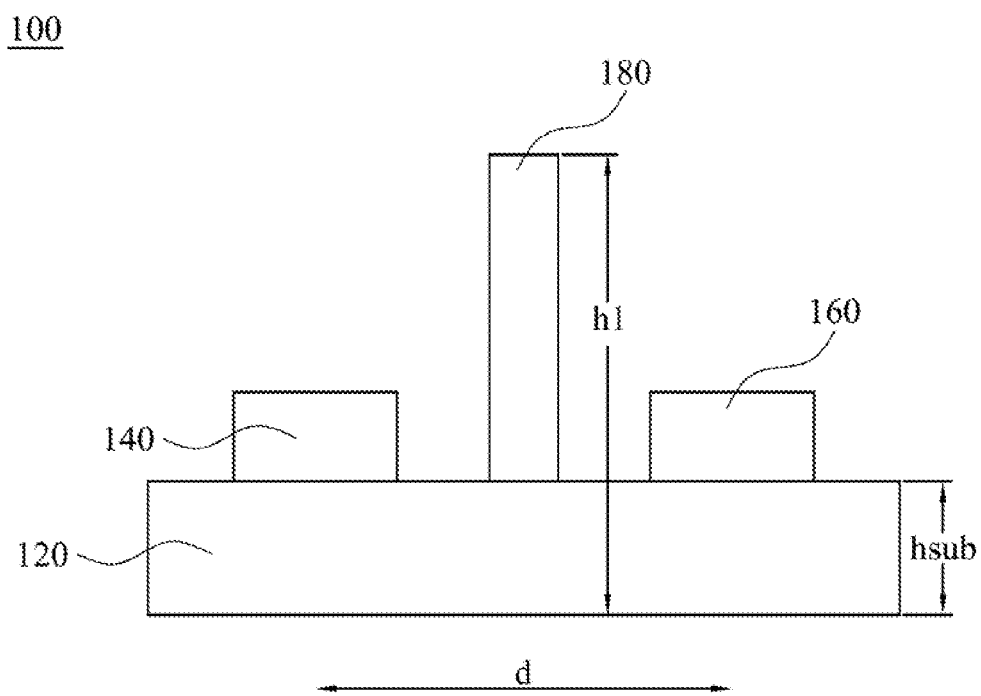
FIG. 1 is a schematic diagram illustrating an electronic device according to one embodiment of the present invention.

Referring to FIG. 1, FIG. 1 is a schematic diagram illustrating an electronic device 100 according to one embodiment of the present invention. As shown in FIG. 1, the electronic device 100 includes a substrate 120, a first device 140, a second device 160, and a shielding wall 180. The substrate 120 can be a printed circuit board (PCB) or other bases for various electronic components to be disposed thereon. The first device 140 and the second device 160 are electronic components disposed on the substrate 120. The first device 140 and the second device 160 can be the chip, radio component, or the metal conductive line. The first device 140 is a main electronic component that is to be prevented from the electromagnetic interference. The second device 160 is the electronic component generating the electromagnetic interference (the main interference). The shielding wall 180 is disposed alone between the first device 140 and the second device 160 and is configured for shielding the electromagnetic interference from the second device 160 to the first device 140. The shielding wall 160 can be made of metal. In the present embodiment, the distance between the center of the first device 140 and the shielding wall 180 is substantially equal to the distance between the center of the second device 160 and the shielding wall 180.

In a process of designing the protection apparatus, the relative positions of the main electronic component (e.g., the first device 140) and the main interference (e.g., the second device 160) can be determined in advance because the protection apparatus is disposed after all electronic components are completely set. Afterwards, in regard to the effect of the main interference, a shielding wall is independently disposed between the main electronic component and the main interference, so as to effectively prevent the main electronic component from the electromagnetic interference. Thus, it is unnecessary to dispose shielding devices surrounding the main electronic component. For example, it is unnecessary to dispose a shielding box that covers the main electronic component entirely, and thus it will not increase the cost.

Figure 2:
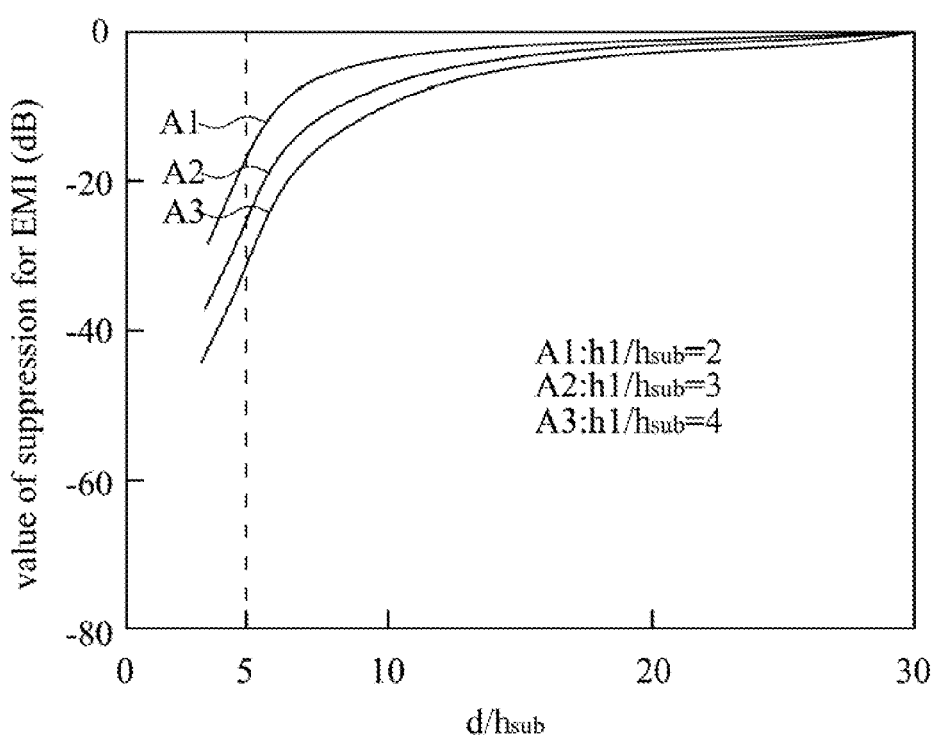
FIG. 2 is a schematic diagram illustrating a relation between the height of the shielding wall and the value of the suppression for the electromagnetic interference according to one embodiment of the present invention.

Referring to both FIG. 1 and FIG. 2, FIG. 2 is a schematic diagram illustrating a relation between the height of the shielding wall and the value of the suppression for the electromagnetic interference according to one embodiment of the present invention. In FIG. 2, the horizontal axis represents the ratio of a relative distance d to the height hsub of the substrate 120, in which the relative distance d is a distance from the center of the first device 140 to the center of the second device 160. The vertical axis represents the value of the electromagnetic interference that the shielding wall 180 can suppress. The graph lines A1, A2, A3 represent the ratios of different height h1 of the shielding wall 180 to the height hsub of the substrate 120, respectively.

As shown in FIG. 2, when the relative distance d between the first device 140 and the second device 160 is fixed, the graph line A3 represents that the suppression of the electromagnetic interference is the best among the graph lines A1, A2, and A3. Specifically, in the condition that the relative distance d is fixed, when the ratio of the height h1 of the shielding wall 180 to the height hsub of the substrate is bigger (i.e., the height h1 of the shielding wall 180 is higher), the suppression of the electromagnetic interference is better. In other words, the height h1 of the shielding wall 180 is determined according to the value of the electromagnetic interference from the second device 160 to the first device 140. When the value of the electromagnetic interference from the second device 160 to the first device 140 is bigger, the height h1 of the shielding wall 180 is required to be higher.

Moreover, for the same graph line (e.g., the graph line A1), when the ratio of the relative distance d between the first device 140 and the second device 160 to the height hsub of the substrate 120 is bigger, the value of the electromagnetic interference that the shielding wall 180 can suppress is required to be smaller. Specifically, when the second device 160 (the main interference) is far away from the first device 140 (the main electronic device), the effect of the second device 160 influencing the first device 140 is reduced. Since the effect is reduced, the value of the electromagnetic interference that the shielding wall 180 can suppress is reduced, too. In other words, the height h1 of the shielding wall 180 is determined according to the relative distance d between the first device 140 and the second device 160. When the relative distance d is bigger, the designer can lower the height h1 of the shielding wall 180 for reducing the cost.

Notably, although the suppression for the electromagnetic interference is better when the height of the shielding wall is higher, the height of the shielding wall fails to be increased unlimited due to a threshold height of the shielding wall. Nevertheless, the threshold height of the shielding wall fails to comply with the value for the suppression of the electromagnetic interference. For example, in FIG. 2, the graph lines A1, A2, and A3 all fail to reach the suppression of 40 dB when the ratio of the relative distance d to the height hsub of the substrate 120 is 5. In other words, if the suppression of 40 dB is required, the height h1 of the shielding wall 180 needs to be increased. However, the increase of the height h1 of the shielding wall 180 will result in that the shielding wall 180 exceeds the limited threshold height of the electronic device 100.

Figure 3:
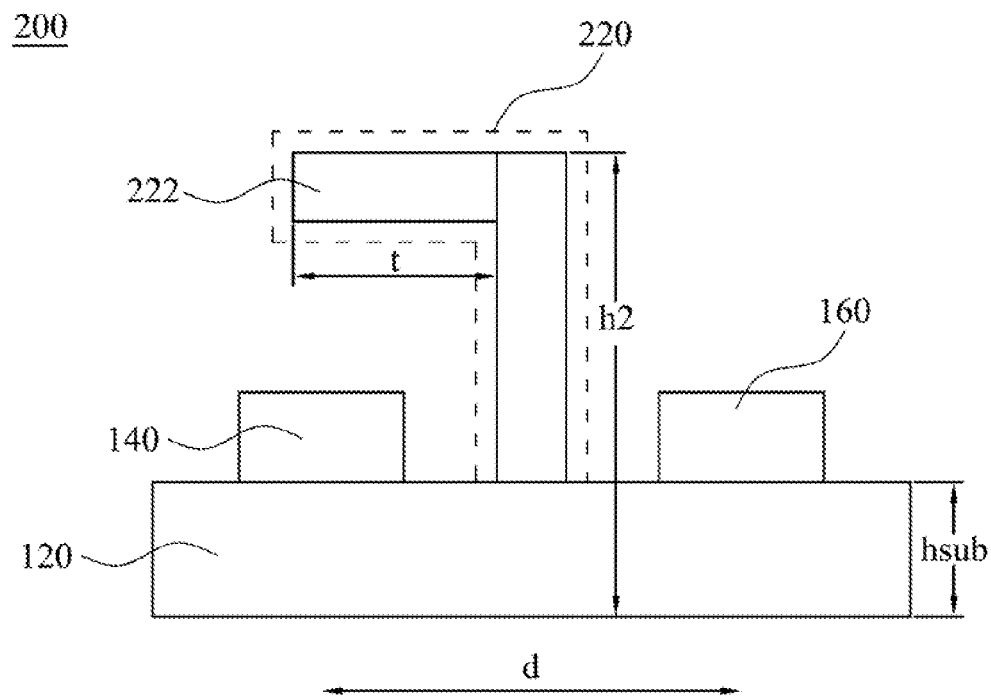
FIG. 3 is a schematic diagram illustrating an electronic device according to one embodiment of the present invention.

Referring to FIG. 3, FIG. 3 is a schematic diagram illustrating an electronic device 200 according to one embodiment of the present invention. As shown in FIG. 3, the electronic device 200 includes the substrate 120, the first device 140, the second device 16, and the shielding wall 220, in which the shielding wall 220 further includes an extension part 222. The extension part 222 is extended from an end of the shielding wall 220 along the direction toward the first device 140. The extension part 222 has a length t and the shielding wall 220 has a height h2. The suppression of the shielding wall 220 for the electromagnetic interference is substantially equal to the suppression of the shielding wall 180 for the electromagnetic interference, in which the height h1 of the shielding wall 180 is equal to the sum of h2 and t.

Figure 4:
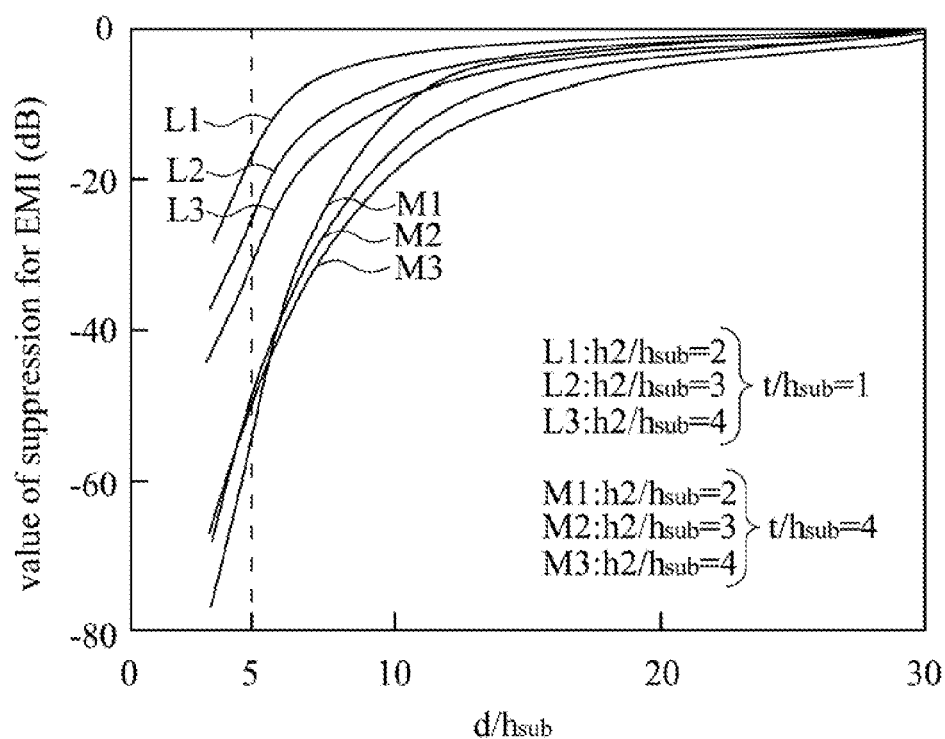
FIG. 4 is a schematic diagram illustrating a relation between the height of the shielding wall with the extension part and the value of the suppression for the electromagnetic interference according to one embodiment of the present invention.

Referring to FIG. 3 and FIG. 4, FIG. 4 is a schematic diagram illustrating a relation between the height of the shielding wall with the extension part and the value of the suppression for the electromagnetic interference according to one embodiment of the present invention. Similarly, the horizontal axis in FIG. 4 represents the ratio of the relative distance d between the center of first device 140 and the center of the second device 160, and the vertical axis represents the value of the electromagnetic interference that the shielding wall 220 can suppress. The graph lines M1 and L1 represent different length t of the extension part 222 in the same height h2 of the shielding wall 220. The graph lines M2 and L2, and the graph lines M3 and L3 are similar to the graph lines M1 and L1. The graph lines L1, L2, and L3 and the graph lines M1, M2, and M3 represent different ratios of the height h2 of the shielding wall 220 to the height hsub of the substrate 120.

As shown in FIG. 4, when d/hsub is fixed, the graph lines M1, M2, and M3 with higher t/hsub (i.e., the shielding wall with the longer extension part) have better suppression for the electromagnetic interference than the graph lines L1, L2, and L3 with lower t/hsub. Specifically, the shielding wall 220 has the longer extension part 222, the equivalent height of the shielding wall 220 is higher. The equivalent height of the shielding wall 220 is higher, the shielding wall 220 has better suppression for the electromagnetic interference.

Accordingly, the designer can determine the height h2 of the shielding wall 220 and the length t of the extension part 222 according to the value of d/hsub on the horizontal axis and the value of the suppression for the electromagnetic interference on the vertical axis in FIG. 4 since the relative distance d and the height hsub of the substrate 120 is determined before disposing the shielding wall 200 between the first device 140 and the second device 160.

In other words, if the height of the shielding wall 220 is higher than the threshold height of the electronic device 200, the shielding wall 220 can be extended horizontally along the direction toward the first device 140 for forming the extension part 222 when the shielding wall 220 reaches to the threshold height. The length of the extension part 222 is obtained by subtracting the threshold height from the equivalent height for the desired value of the suppression for the electromagnetic interference. In other words, the sum of the threshold height and the length of the extension part is substantially equal to the equivalent height of the shielding wall. Accordingly, the shielding wall can be disposed in order to reach the value of the suppression for the electromagnetic interference without exceeding the threshold height.

Figure 5:
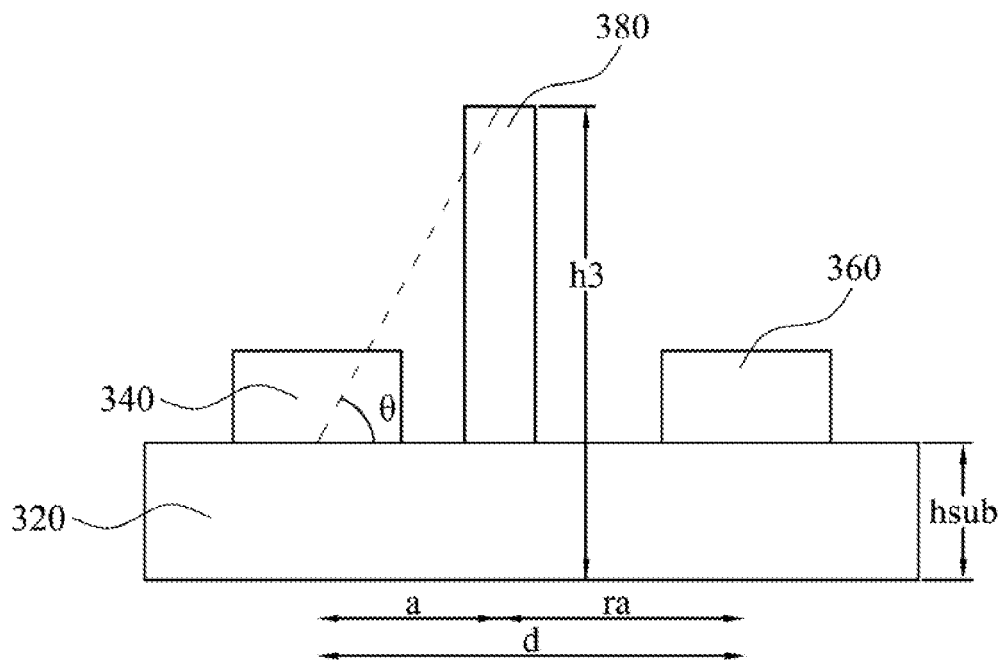
FIG. 5 is a schematic diagram illustrating an electronic device according to one embodiment of the present invention.

Referring to FIG. 5, FIG. 5 is a schematic diagram illustrating an electronic device 300 according to one embodiment of the present invention. The electronic device 300 includes a substrate 320, a first device 340, a second device 360, and a shielding wall 380, in which the distance between the center of the first device 340 and the shielding wall 380 is different from the distance between the center of the second device 360 and the shielding wall 380. There is an angle of elevation θ formed from the center of the first device 340 to the top of the shielding wall 380. When the angle of elevation θ is bigger, the height h3 of the shielding wall 380 is higher and the suppression for the electromagnetic interference is better.

Figure 6:
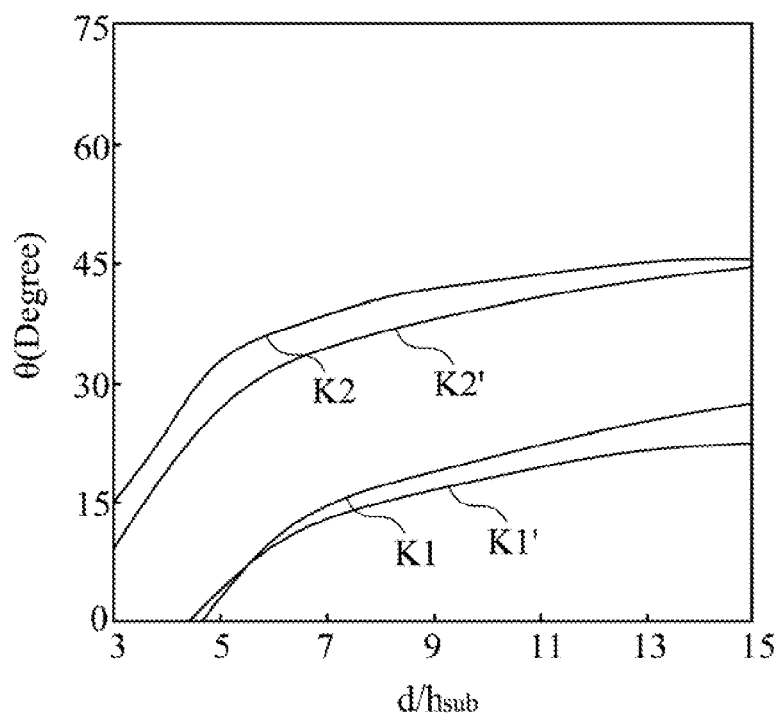
FIG. 6 is a contour diagram illustrating a relation between the angle of elevation and the value of the suppression for the electromagnetic interference according to one embodiment of the present invention.

Referring to FIG. 5 and FIG. 6, FIG. 6 is a contour diagram illustrating a relation between the angle of elevation θ and the value of the suppression for the electromagnetic interference according to one embodiment of the present invention. The horizontal axis in FIG. 6 represents the ratio of the relative distance d to the height hsub of the substrate 320, wherein the relative distance d is between the center of the first device 340 and the center of the second device 360. The vertical axis represents the angle of elevation θ from the center of the first device 340 to the top of the shielding wall 380. The graph lines K1 and K1' represent a value of the suppression for the electromagnetic interference (e.g., 5 dB), and the graph lines K2 and K2' represent another value of the suppression for the electromagnetic interference (e.g., 15 dB).

Similarly, when the relative distance d between the first device 340 and the second device 360 is fixed, the bigger angle of elevation θ represents that the height h3 of the shielding wall 380 is higher and the value of the suppression for the electromagnetic interference is bigger. In other words, the angle of elevation θ is determined according to the value of the electromagnetic interference from the second device 360 (the main interference) to the first device 340 (the main electronic device). When the value of the electromagnetic interference from the second device 360 to the first device 340 is bigger, the design of the angle of elevation θ requires to be bigger.

Furthermore, in the present embodiment, the distance between the center of the first device 340 and the shielding wall 380 is different from the distance between the center of the second device 360 and the shielding wall 380. There is a relative ratio r of the distance between the center of the first device 340 and the shielding wall 380 to the distance between the second device 360 and the shielding wall 380. Suppose the distance between the center of the first device 340 and the shielding wall 380 is a, the distance between the center of the second device 360 and the shielding wall 380 is ra, wherein (1+r)*a=d.

As shown in FIG. 6, the graph lines K1, and K2 represent the contours related to the angle of elevation θ with a relative ratio (e.g., r=1) associated with the value of the suppression of the electromagnetic interference. The graph lines K1', and K2' represent the contours related to the angle of elevation θ with another relative ratio (e.g., r=2) associated with the value of the suppression of the electromagnetic interference. When the value of the suppression for the electromagnetic interference is fixed, the graph lines K1 and K1' (or the graph lines K2 and K2') with different relative ratios require different angles of elevation. Since the difference of the relative ratio represents that the distance between the shielding wall 380 and the first device 340 is different from the distance between the distance between the shielding wall 380 and the second device 360, the value of the suppression for the electromagnetic interference through the shielding wall 380 is different. In other words, the angle of elevation θ is determined according to the relative ratio r, wherein the angle of elevation θ further determines the height of the shielding wall.

Accordingly, when the shielding wall 380 is disposed between the first device 340 and the second device 360, the relative distance d between the center of the first device 340 and the center of the second device 360 can be obtained, and the distance a between the center of the first device 340 and the shielding wall 380 and the distance ra between the center of the second device 360 and the shielding wall 380 can further be obtained. Then, the angle of elevation θ can be determined according to the value of d/hsub on the horizontal axis in FIG. 6, the relative ration r, and the value of the suppression for the electromagnetic interference. After the angle of elevation θ is determined, the height h3 of the shielding wall 380 can be obtained through adding the height hsub of the substrate 320 to the distance a multiplied by the tangent of the angle of elevation (tan θ).

Figure 7:
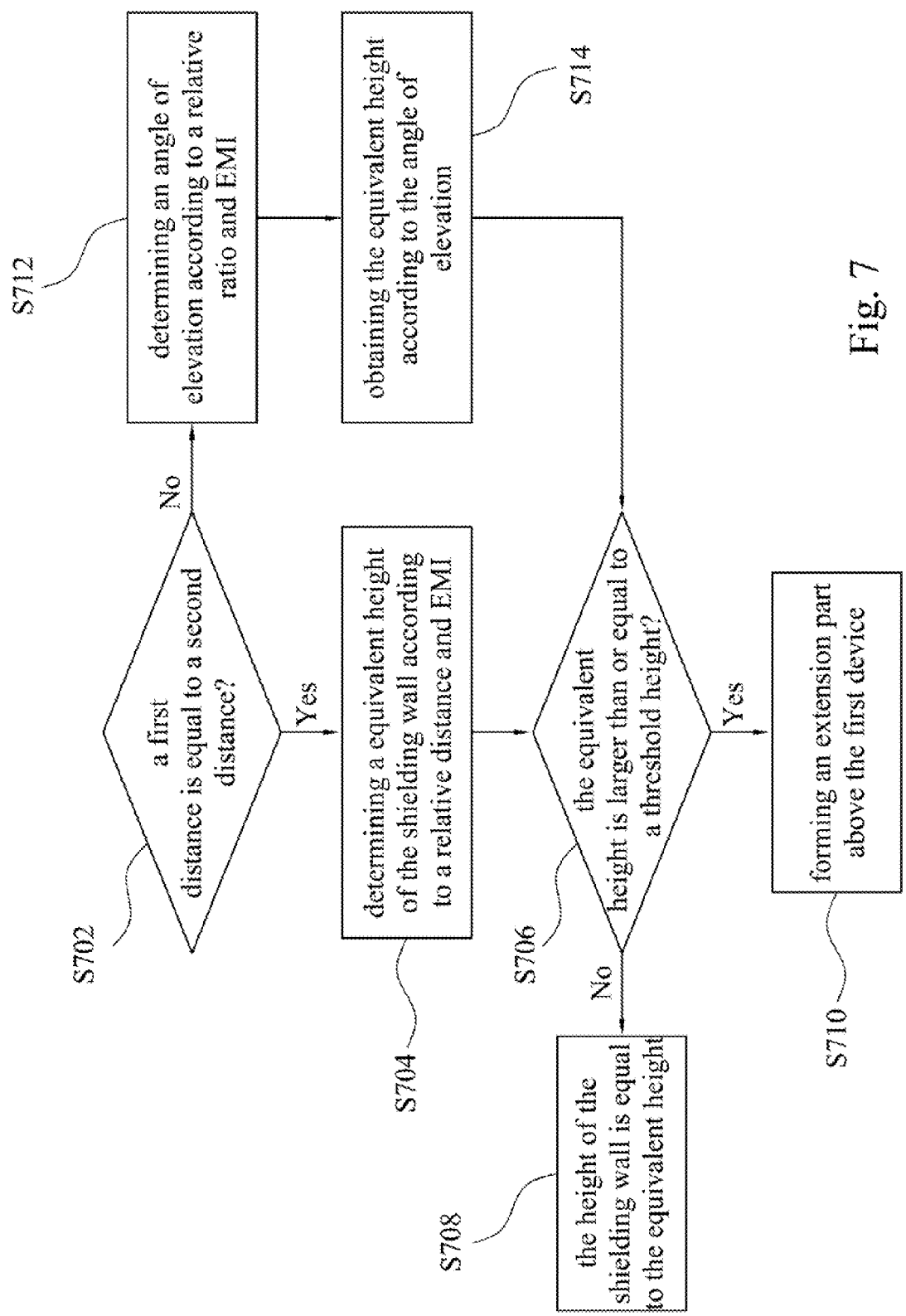
FIG. 7 is a flowchart of a method for disposing the shielding wall according to one embodiment of the present invention.

Referring to FIG. 7, FIG. 7 is a flowchart of a method for disposing the shielding wall according to one embodiment of the present invention. First, a first device and a second device is disposed on a substrate, and a shielding wall is disposed independently between the first device and the second device. Then, in operation S702, whether a first distance between the first device and the shielding wall is equal to a second distance between the second device and the shielding wall is determined. Specifically, the operation S702 represents predetermining the position of the shielding wall and the relative distance between the first device and the second device. When the first distance is equal to the second distance, an equivalent height of the shielding wall according to the relative distance and the value of the electromagnetic interference from the second device to the first device is obtained in operation S704. After the equivalent distance of the shielding wall is determined, whether the equivalent distance is larger than a threshold height of the shielding wall is determined in operation S706. When the equivalent height of the shielding wall is smaller than the threshold height, the height of the shielding wall is determined to be equal to the equivalent height is operation S708. When the equivalent height of the shielding wall is larger than or equal to the threshold height, an end of the shielding wall is extended horizontally toward the first device and an extension part is formed above the first device in operation S710. It is worth note that the sum of the length of the extension part and the threshold height is substantially equal to the equivalent height of the shielding wall.

Furthermore, when the first distance (the distance between the first device and the shielding wall) is different from the second distance (the distance between the second device and the shielding wall), a relative ratio of the first distance to the second distance is determined and an angle of elevation from the first device to the top of the shielding wall is determined according to the relative ratio and the value of the electromagnetic interference from the second device to the first device in operation S712. Then, the equivalent height of the shielding wall is obtained through adding the height of the substrate to the first distance multiplied by the tangent of the angle of elevation. After the equivalent height of the shielding wall is determined, operations S706~S710 are executed again for determining whether to add the extension part according to the height of the shielding wall and the threshold height.

As illustrated from the embodiments of the present invention, disposing the shielding wall alone inside the electronic device is an effective approach for preventing the electronic device (the main electronic device) from the electromagnetic interference (the main interference). Moreover, the design of the shielding wall with extension part not only enhances the value of the suppression for the electromagnetic interference, bus also make the electronic device comply with the limitation of the height. Therefore, it is unnecessary to dispose the shielding apparatus around the main electronic device. In other words, the present invention can simplify the complexity of assembling the electronic device and save the cost.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded with the broadest interpretation so as to encompass all such modifications and similar structures.

What is claimed is:

1. A method for manufacturing an electronic device, comprising:

disposing separately a first device and a second device on a substrate, wherein the second device generates an electromagnetic interference;

disposing independently a shielding wall between the first device and the second device, wherein the shielding wall is configured for shielding the electromagnetic interference;

determining a first distance between the first device and the shielding wall and a second distance between the second device and the shielding wall;

obtaining an equivalent height of the shielding wall according to the first distance, the second distance, and a value of the electromagnetic interference from the second device to the first device, wherein the equivalent height of the shielding wall is inversely proportional to a distance of the first distance plus the second distance, and proportional to the value of electromagnetic interference from the second device to the first device; and determining whether the equivalent height of the electronic device is larger than a threshold height; and extending an end of the shielding wall horizontally toward the first device to form an extension part above the first device when the equivalent height is larger than the threshold height, wherein a sum of a length of the extension part and the threshold height is substantially equal to the equivalent height.

2. The manufacturing method as claimed in claim 1, wherein obtaining the equivalent according to the first distance, the second distance, and the value of electromagnetic interference further comprises:

determining an angle of elevation from the first device to the top of the shielding wall according to a relative ratio of the first distance to the second distance and the value of the electromagnetic interference from the second device to the first device when the first distance is different from the second distance; and obtaining the equivalent height according to the angle of elevation.

* * * * *